(12) United States Patent
Chen et al.

(10) Patent No.: US 9,773,784 B2
(45) Date of Patent: Sep. 26, 2017

(54) SEMICONDUCTOR STRUCTURE AND METHOD FOR MANUFACTURING THE SAME

(75) Inventors: Chieh-Chih Chen, Hukou Shiang (TW); Cheng-Chi Lin, Toucheng Township, Yilan County (TW); Shih-Chin Lien, New Taipei (TW); Shyi-Yuan Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 395 days.

(21) Appl. No.: 13/594,296

(22) Filed: Aug. 24, 2012

(65) Prior Publication Data

US 2014/0054656 A1 Feb. 27, 2014

(51) Int. Cl.

| | |
|---|---|
| H01L 29/78 | (2006.01) |
| H01L 27/088 | (2006.01) |
| H01L 21/761 | (2006.01) |
| H01L 29/66 | (2006.01) |
| H01L 21/8234 | (2006.01) |
| H01L 29/423 | (2006.01) |
| H01L 29/06 | (2006.01) |
| H01L 29/08 | (2006.01) |

(52) U.S. Cl.
CPC .......... *H01L 27/088* (2013.01); *H01L 21/761* (2013.01); *H01L 21/823481* (2013.01); *H01L 29/66681* (2013.01); *H01L 29/7816* (2013.01); *H01L 21/823418* (2013.01); *H01L 29/0634* (2013.01); *H01L 29/0696* (2013.01); *H01L 29/0878* (2013.01); *H01L 29/42368* (2013.01)

(58) Field of Classification Search
CPC ............ H01L 29/0623; H01L 27/0617; H01L 27/0623
See application file for complete search history.

(56) References Cited

U.S. PATENT DOCUMENTS

| | | | | |
|---|---|---|---|---|
| 3,974,516 | A * | 8/1976 | Steinmaier | ............ H01L 21/223 257/370 |
| 5,237,193 | A * | 8/1993 | Williams | ............ H01L 29/1087 257/336 |
| 6,350,663 | B1 * | 2/2002 | Kopley | ................. H01L 21/761 257/291 |
| 2004/0140517 | A1 * | 7/2004 | Tsuchiko | ...................... 257/493 |

FOREIGN PATENT DOCUMENTS

| | | |
|---|---|---|
| TW | 201214667 A1 | 4/2012 |
| TW | 201227961 A1 | 7/2012 |

\* cited by examiner

*Primary Examiner* — Eugene Lee
(74) *Attorney, Agent, or Firm* — McClure, Qualey & Rodack, LLP

(57) ABSTRACT

A semiconductor structure and a method for manufacturing the same are provided. The semiconductor structure comprises a substrate, a device region, a first doped region and a gate structure. The first doped region is formed in the substrate adjacent to the device region. The gate structure is on the first doped region. The first doped region is overlapped the gate structure.

19 Claims, 18 Drawing Sheets

SEMICONDUCTOR STRUCTURE AND METHOD FOR MANUFACTURING THE SAME

BACKGROUND

Technical Field

The disclosure relates in general to a semiconductor structure and a method for manufacturing the same and more particularly to a semiconductor structure having an isolating region and a method for manufacturing the same.

Description of the Related Art

In the semiconductor technology, the feature size of the semiconductor structure has been reduced. In the meantime, the rate, the efficiency, the density and the cost per integrated circuit unit have been improved.

Shrinking the device area would drop the electrical efficiency of the semiconductor structure dramatically. For maintain the electrical efficiency of the semiconductor structure, especially in a case of HV device, the semiconductor structure must use a big device area. However, it retards development for scaling down the semiconductor structure.

SUMMARY

A semiconductor structure is provided. The semiconductor structure comprises a substrate, a device region, a first doped region and a gate structure. The first doped region is formed in the substrate adjacent to the device region. The gate structure is on the first doped region. The first doped region is overlapped the gate structure.

A semiconductor structure is provided. The semiconductor structure comprises a substrate, a device region, a first doped region and a gate structure. The first doped region is formed in the substrate adjacent to device region. The gate structure is on the first doped region. At least one of the first doped region and the gate structure has a symmetrical shape.

A method for manufacturing a semiconductor structure is provided. The method comprises following steps. A first doped region is formed in a substrate adjacent to a device region. A gate structure is formed on the first doped region. The first doped region is overlapped with the gate structure.

The above and other aspects of the disclosure will become better understood with regard to the following detailed description of the non-limiting embodiment(s). The following description is made with reference to the accompanying drawings.

DETAILED DESCRIPTION

Figure 1:
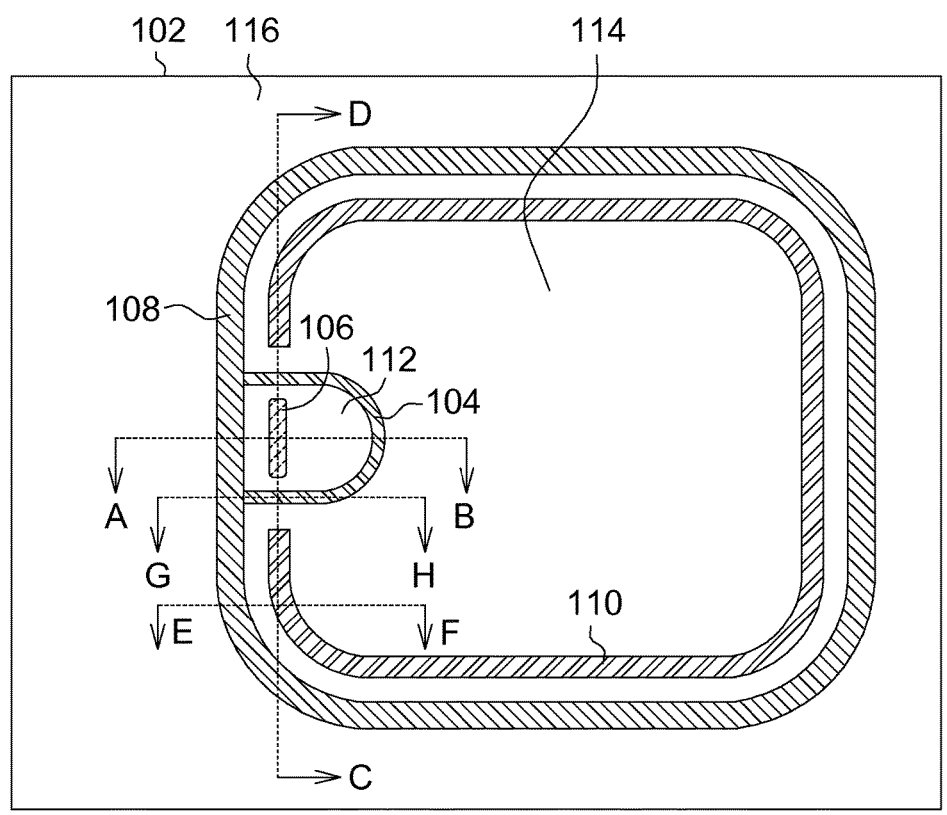
FIG. 1 illustrates a top view of a semiconductor structure according to one embodiment.

FIG. 1 illustrates a top view of a semiconductor structure according to one embodiment, showing only a substrate 102, a first doped region 104, a second doped region 106, a third doped region 108, a fourth doped region 110 and a device region. In embodiments, the first doped region 104, the second doped region 106, the third doped region 108 and the fourth doped region 110 formed in the substrate 102 has the same first type conductivity, such as P type conductivity.

Referring to FIG. 1, the device region comprises a first device region 112, a second device region 114 and a third device region 116. In embodiments, the first device region 112, the second device region 114 and the third device region 116 are used for disposing devices of different types, respectively. For example, the first device region 112 is a UHV device region and used for disposing devices such as a UHVMOS or other suitable devices. The second device region 114 may be used as a high side region (for higher than 650V, for example, for disposing devices such as LVMOS, BJT, capacitor, resistor or other suitable devices. The third device region 116 may be used as a LV device region, for disposing devices such as LVMOS or other suitable devices.

Referring to FIG. 1, for example, the first doped region 104 and the third doped region 108 is along an outer edge of the first device region 112. In other words, the first device region 112 may be defined by the first doped region 104 and the third doped region 108. The first doped region 104 and the fourth doped region 110 is along an outer edge of the second device region 114. In other words, the second device region 114 may be defined by the first doped region 104 and the fourth doped region 110. The second doped region 106 is in the first device region 112. The second doped region 106 is separated from the first doped region 104 and the third doped region 108. The fourth doped region 110 is separated from the first doped region 104 and the third doped region 108. In embodiments, the first doped region 104 is used for isolation, such as for isolating the first device region 112 and the second device region 114.

Referring to FIG. 1, in embodiments, the first doped region 104 has a symmetrical shape (profile) such as U shape substantially. The third doped region 108 has a symmetrical shape (profile) substantially. The fourth doped region 110 has a symmetrical shape (profile) substantially. The symmetrical shapes as mentioned uses a fictitious plane passing through a center of the second doped region 106 such as a fictitious plane along AB line as a symmetry axis. In embodiments, using the symmetrical layout design can improve BVD uniformity of the device.

Figure 2:
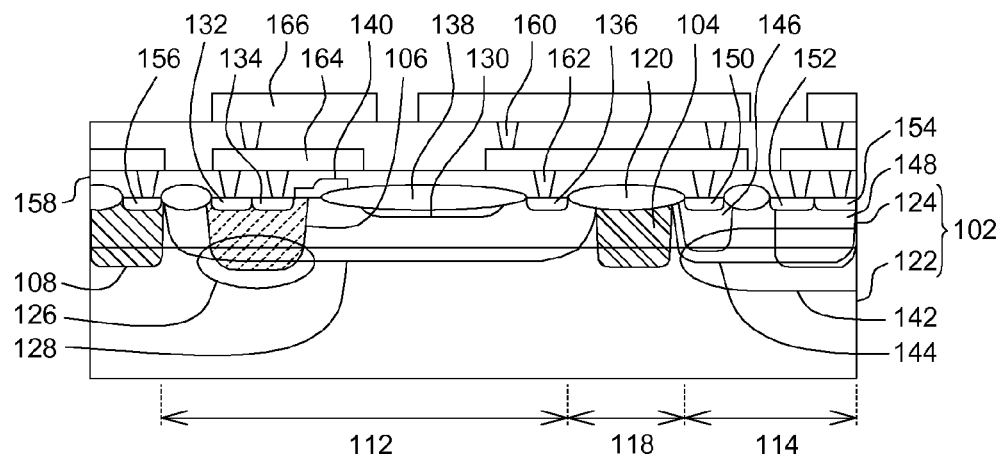
FIG. 2 illustrates a cross-section view of a semiconductor structure according to one embodiment.

FIG. 2 illustrates a cross-section view of the semiconductor structure along AB line in FIG. 1. The semiconductor structure comprises an isolating region 118 between the first device region 112 and the second device region 114. In embodiments, the first doped region 104 is formed in the substrate 102 in the isolating region 118. The first doped region 104 can be used for isolation and self-shielding. A dielectric structure 120 is formed on the first doped region 104.

Referring to FIG. 2, the substrate 102 comprises a lower doped region 122 and a upper doped region 124 on the lower doped region 122. For example, the lower doped region 122 may comprise a SOI, a doped well region formed by doping a wafer or other suitable materials. The upper doped region 124 may be an epitaxial film grown from the lower doped region 122. In this embodiment, the lower doped region 122 and the upper doped region 124 have the same first type conductivity such as P type conductivity.

Referring to FIG. 2, the first device region 112 comprises a doped buried layer 126 that may be formed in the lower doped region 122 and the upper doped region 124. The doped buried layer 126 may have a second type conductivity opposite to the first type conductivity, such as N type conductivity. A doped well region 128 may be formed in the lower doped region 122, the upper doped region 124 and the doped buried layer 126. The doped well region 128 may have the second type conductivity such as N type conductivity. In embodiments, the doped well region 128 has an enough depth to sustain HV operations for the device. The second doped region 106 may be formed in the doped well region 128 and the doped buried layer 126. The second doped region 106 may have the first type conductivity such as P type conductivity. A top doped region 130 may be formed in the doped well region 128. The top doped region 130 may have the first type conductivity such as P type conductivity. The top doped region 130 can be used for realizing RESURF concept. Doped contact regions 132, 134 may be formed in the second doped region 106. A doped contact region 136 may be formed in the doped well region 128. The doped contact regions 132, 134, 136 may be heavily doped. The doped contact region 132 may have the first type conductivity such as P type conductivity. The doped contact regions 134, 136 may have the second type conductivity such as N type conductivity. The doped contact region 134 may be used as a source. The doped contact region 136 may be used as a drain. The doped contact region 132 may be used as a base. A dielectric structure 138 may be formed on the top doped region 130 and the doped well region 128. A gate 140 may be formed on the second doped region 106 and the dielectric structure 138. In one embodiment, devices formed in the first device region 112 may comprise a MOS such as NMOS or a UHVNMOS having a breakdown voltage higher than 650V. The doped buried layer 126 can provide an isolation effect between the doped contact region 134 such as source and the lower doped region 122 of the substrate 102.

Referring to FIG. 2, the second device region 114 comprises a doped buried layer 142 that may be formed in the lower doped region 122 and the upper doped region 124. The doped buried layer 142 may have the second type conductivity opposite to the first type conductivity, such as N type conductivity. A doped well region 144 may be formed in the lower doped region 122, the upper doped region 124 and the doped buried layer 142. The doped well region 144 may have the second type conductivity such as N type conductivity. A doped well region 146 may be formed in the doped well region 144. The doped well region 146 may have the second type conductivity such as N type conductivity. A doped well region 148 may be formed in the doped well region 144 and the doped buried layer 142. The doped well region 148 may have the first type conductivity such as P type conductivity. A doped contact region 150 may be formed in the doped well region 146. Doped contact regions 152, 154 may be formed in the doped well region 148. The doped contact region 150, 152, 154 may be heavily doped. The doped contact region 152 may have the first type conductivity such as P type conductivity. The doped contact regions 150, 154 may have the second type conductivity such as N type conductivity. In embodiments, the doped well region 144 has an enough depth to sustain HV operations for devices. The doped buried layer 142 in the second device region 114 can avoid punch through from the HV region to the lower doped region 122 (ground) of the substrate 102.

Referring to FIG. 2, a doped contact region 156 is formed in the third doped region 108. Multi-layer dielectric layer 158 may be formed on the substrate 102. Conductive plugs 160, 162 and conductive layers 164, 166 such as M1, M2 formed in the dielectric layer 158 may be electrically connected to the doped contact region 132, 134, 136, 150, 152, 154, 156. In embodiments, the conductive layers 164, 166 crossing the isolating region 118 and over the first doped region 104 are used for interconnection such as HV interconnection.

Figure 3:
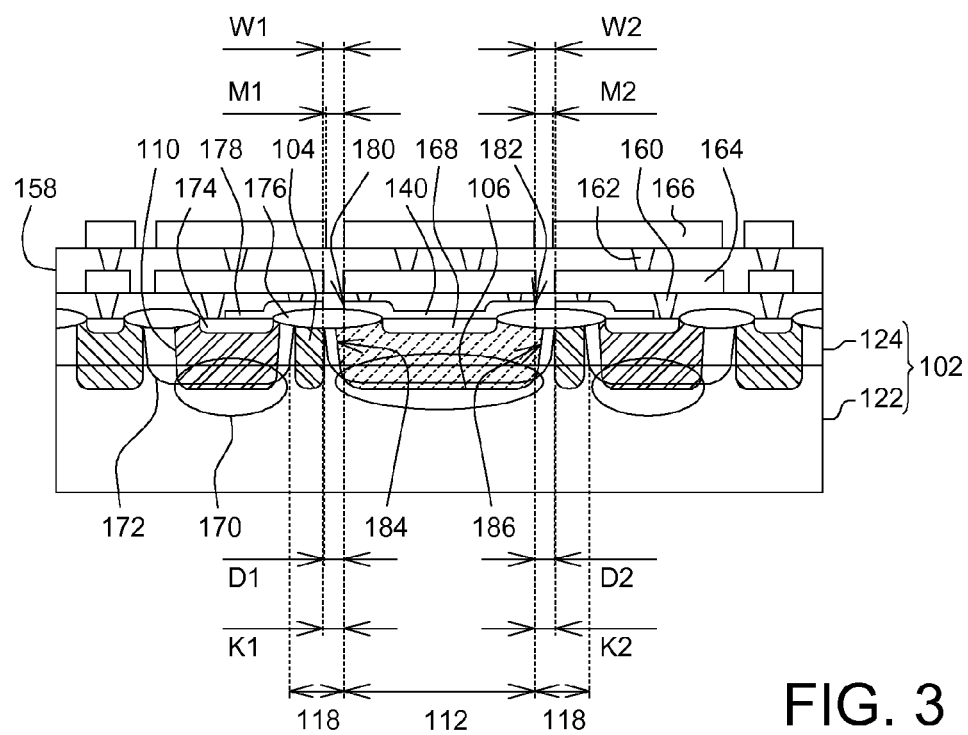
FIG. 3 illustrates a cross-section view of a semiconductor structure according to one embodiment.

FIG. 3 illustrates a cross-section view of the semiconductor structure along CD line in FIG. 1. FIG. 3 shows that the gate 140 is on the second doped region 106 in the first device region 112. A doped region 168 may be formed in the second doped region 106 under the gate 140. The doped region 168 may have the second type conductivity such as N type conductivity. The doped region 168 may be heavily doped. For example, the doped region 168 may be the doped contact region 134 as shown in FIG. 2. A doped buried layer 170 may be formed in the lower doped region 122 and the upper doped region 124 out of the isolating region 118. A doped well region 172 may be formed in the lower doped region 122, upper doped region 124 and the doped buried layer 170. The doped well region 172 may have the second type conductivity such as N type conductivity. The fourth doped region 110 may be formed in the doped well region 172 and the doped buried layer 170. The fourth doped region 110 may have the first type conductivity such as P type conductivity. A doped contact region 174 may be formed in the fourth doped region 110. The doped contact region 174 may be heavily doped. The doped contact region 174 may have the second type conductivity such as N type conductivity.

Referring to FIG. 3, in embodiments, a dielectric structure 176 is formed on the first doped region 104, the second doped region 106, and the fourth doped region 110. A gate structure 178 is formed on the dielectric structure 176.

Moreover, the first doped region 104, the dielectric structure 176 and the gate structure 178 are overlapped with each other. In embodiments, the dielectric structure 176 may have a symmetrical shape. In some embodiments, the gate structure 178 may have a symmetrical shape. The symmetrical shapes as mentioned uses a fictitious plane passing through a center of the second doped region 106 such as a fictitious plane along AB line (FIG. 1) as a symmetry axis. The gate structure 178 may be on the doped contact region 174. Referring to FIG. 3, in one embodiment, the gate 140 has a first gate sidewall 180 and a second gate sidewall 182 opposite to the first gate sidewall 180. The smallest gap distance D1 between the first doped region 104 and the first gate sidewall 180 of the gate 140 is substantially equal to the smallest gap distance D2 between the (first doped region 104 and the second gate sidewall 182 of the gate 140. In some embodiments, the smallest gap distance K1 between the gate structure 178 and the first gate sidewall 180 of the gate 140 is substantially equal to the smallest gap distance K2 between the gate structure 178 and the second gate sidewall 182 of the gate 140. In one embodiment, the second doped region 106 has a first doped sidewall 184 and a second doped sidewall 186 opposite to the first doped sidewall 184. The smallest gap distance M1 between the first doped region 104 and the first doped sidewall 184 of the second doped region 106 is substantially equal to the smallest gap distance M2 between the first doped region 104 and the second doped sidewall 186 of the second doped region 106. In some embodiments, the smallest gap distance W1 between the gate structure 178 and the first doped sidewall 184 of the second doped region 106 is substantially equal to the smallest gap distance W2 between the gate structure 178 and the second doped sidewall 186 of the second doped region 106. In embodiments, the symmetrical layout designs for the semiconductor structure can improve the BVD uniformity for the devices. The design that the first doped region 104 is overlapped with the gate structure 178, or the first doped region 104 is covered by the gate structure 178 can avoid coupling effect. In one embodiment, for example, the gate structure 178 is grounded. The first doped region 104 can be used for isolation and self-shielding for UHVMOS.

Figure 4:
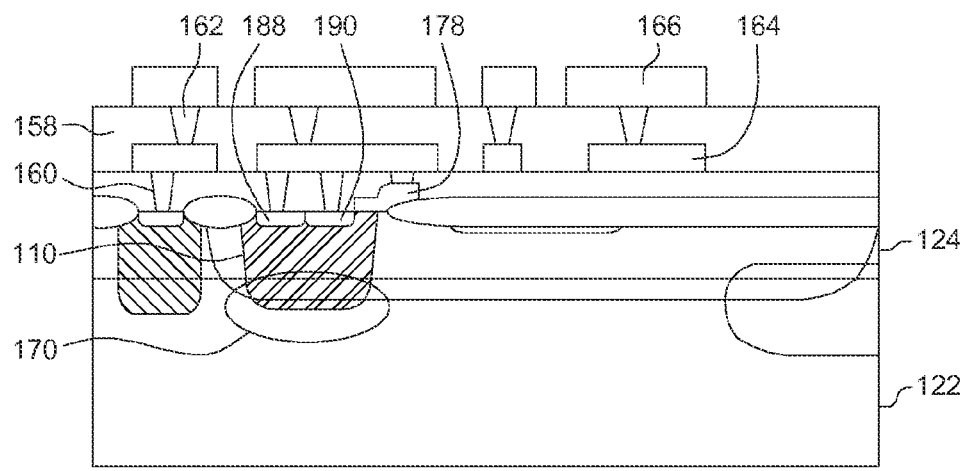
FIG. 4 illustrates a cross-section view of a semiconductor structure according to one embodiment.

FIG. 4 illustrates a cross-section view of the semiconductor structure along EF line in FIG. 1. FIG. 4 shows that a doped contact region 188 may be formed in the fourth doped region 110 and adjacent to a doped contact region 190. The doped contact region 188 and the doped contact region 190 may be heavily doped. The doped contact region 188 may have the first type conductivity such as P type conductivity. The doped contact region 190 may have the second type conductivity such as N type conductivity. The doped contact region 190 may be the doped contact region 174 shown in FIG. 3. The gate structure 178 may be on the fourth doped region 110. The doped buried layer 170 may be formed in the lower doped region 122 and the upper doped region 124.

Figure 5:
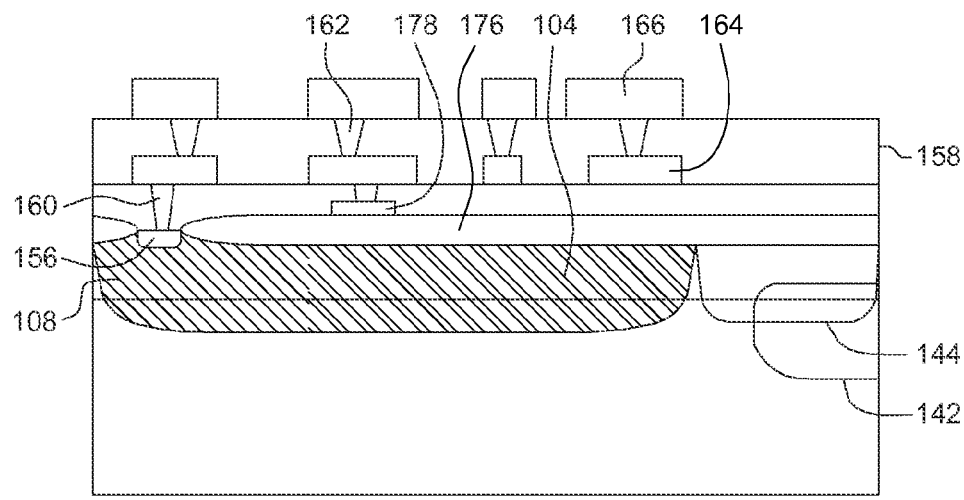
FIG. 5 illustrates a cross-section view of a semiconductor structure according to one embodiment.

FIG. 5 illustrates a cross-section view of the semiconductor structure along GH line in FIG. 1. FIG. 5 shows that the first doped region 104 and the third doped region 108 are adjoined to each other. In other words, the first doped region 104 and the third doped region 108 are a common doped region. The doped contact region 156 may be formed in the third doped region 108. The doped contact region 156 may be heavily doped. The doped contact region 156 may have the first type conductivity such as P type conductivity. The gate structure 178 is on the dielectric structure 176.

In embodiments, the layout designs for the semiconductor structure can improve the BVD uniformity for the devices. In embodiments, a current leakage from a high side to a low side is smaller than 1 uA. Moreover, the UHV cell verification is ok after the HTGB and HTRB reliability test. An area for the layout design for the semiconductor structure is not increased. No addition process is needed. The concepts in embodiments can be applied for mix-mode or analog circuit designs or other suitable designs such as a LED lighting device, an energy saving lamp, a ballast, a motor driver, etc.

Figure 6A:
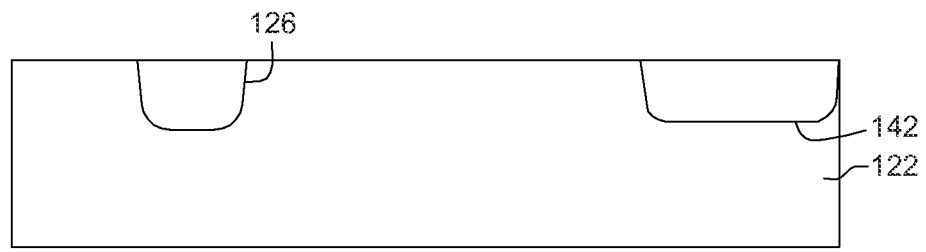
FIG. 6A to FIG. 6D illustrate a manufacturing method for a semiconductor structure according to one embodiment.

FIG. 6A to FIG. 6D illustrate a manufacturing method for the semiconductor structure in FIG. 2. Referring to FIG. 6A, the doped buried layers 126, 142 having the second type conductivity such as N type conductivity are formed in the lower doped region 122 having the first type conductivity such as P type conductivity by a doping step. In embodiments, various doping steps may be performed with using a patterned mask. Otherwise, an annealing step may be performed at any suitable timing after the doping steps, for diffusing impurities. Similar concepts will not be described in detail in the following.

Figure 6B:
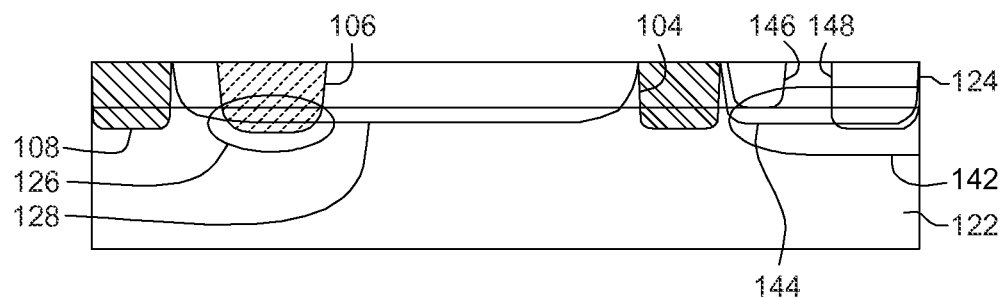

Referring to FIG. 6B, the upper doped region 124 is formed on the lower doped region 122. The upper doped region 124 may be formed by an epitaxial method. The upper doped region 124 may have the first type conductivity such as P type conductivity. In one embodiment, the doped buried layers 126, 142 may be diffused into the upper doped region 124 by an annealing step. The doped well regions 128, 144 having the second type conductivity such as N type conductivity are formed by doping the upper doped region 124, the lower doped region 122, and the doped buried layers 126, 142. The second doped region 106 having the first type conductivity such as P type conductivity are formed by doping the doped well region 128 and the doped buried layer 126. The first doped region 104 having the first type conductivity such as P type conductivity is formed by doping the upper doped region 124 and the lower doped region 122. The third doped region 108 having the first type conductivity such as P type conductivity is formed by doping the upper doped region 124 and the lower doped region 122. The doped well region 148 having the first type conductivity such as P type conductivity is formed by doping the doped well region 144 and the doped buried layer 142. The doped well region 146 having the second type conductivity such as N type conductivity is formed by doping the doped well region 144 and the doped buried layer 142.

Figure 6C:
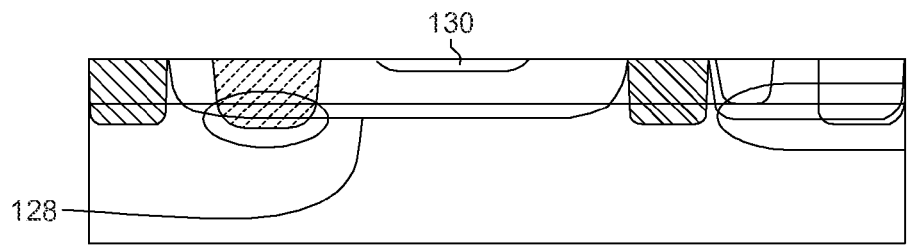
Figure 6D:
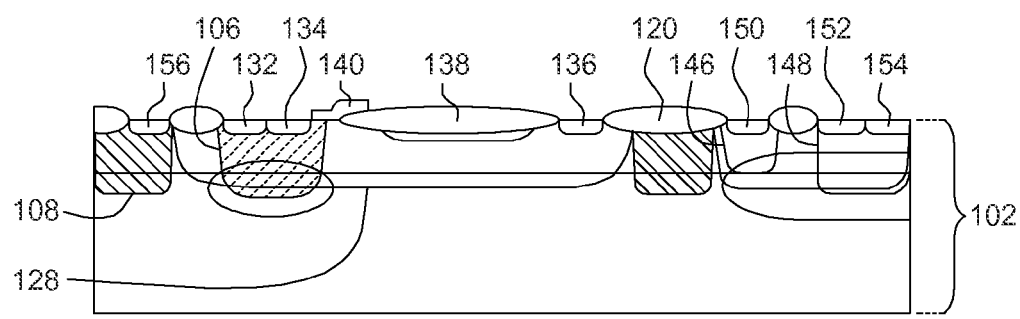

Referring to FIG. 6C, the top doped region 130 having the first type conductivity such as P type conductivity is formed by doping the doped well region 128. Referring to FIG. 6D, the dielectric structures 120, 138 are formed on the substrate 102. The dielectric structures 120, 138 are not limited to FOX as shown in FIG. 6C. In other embodiments, the dielectric structures 120, 138 may comprise other suitable insulating structures such as STI. The gate 140 is formed on the substrate 102. The gate 140 may comprise a gate dielectric layer and a gate electrode layer on the gate dielectric layer. The gate electrode layer may comprise a poly-silicon, metal or other suitable material. The gate dielectric layer may comprise oxide, nitride, oxy-nitride or other suitable materials The gate 140 may comprise a gate dielectric layer and a gate electrode layer on the gate dielectric layer. The gate electrode layer may comprise a poly-silicon, metal or other suitable material. The gate dielectric layer may comprise oxide, nitride, oxy-nitride or other suitable materials. The doped contact regions 152, 132, 156 having the first type conductivity such as P type conductive are formed by doping the doped well region 148, the second doped region 106 and the third doped region 108. The doped contact regions 134, 136, 150, 154 having the second type conductivity such as N type conductivity are formed by doping the doped well regions 128, 146, 148 and the second doped region 106. Next, other elements may be formed on the structure as shown in FIG. 6D, such as the dielectric layer 158, the conductive layers 164, 166 and the conductive plugs 160, 162 to form the semiconductor structure as shown in FIG. 2.

Figure 7A:
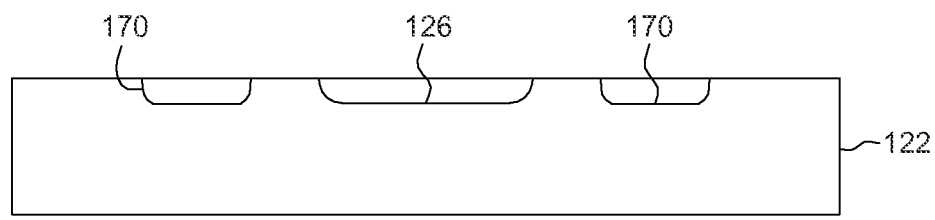
FIG. 7A to FIG. 7C illustrate a manufacturing method for a semiconductor structure according to one embodiment.
Figure 7B:
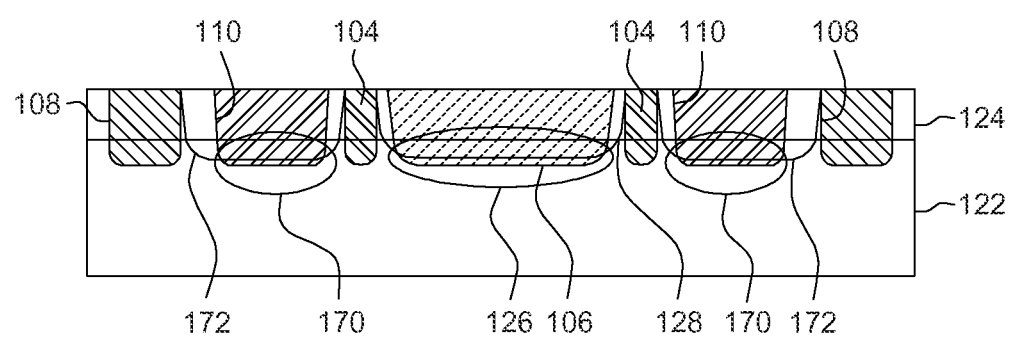
Figure 7C:
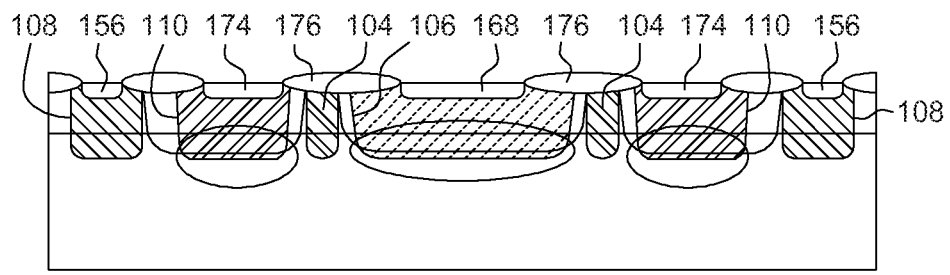

FIG. 7A to FIG. 7C illustrate a manufacturing method for the semiconductor structure in FIG. 3. Referring to FIG. 7A, the doped buried layers 126, 170 having the second type conductivity such as N type conductivity are formed by doping the lower doped region 122 having the first type conductivity such as P type conductivity.

Referring to FIG. 7B, the upper doped region 124 is formed on the lower doped region 122. The upper doped region 124 may be formed by an epitaxial method. The upper doped region 124 may have the first type conductivity such as P type conductivity. In one embodiment, the doped buried layers 126, 170 may be diffused into the upper doped region 124 by an annealing step. The doped well regions 128, 172 having the second type conductivity such as N type conductivity is formed by doping the upper doped region 124, the lower doped region 122 and the doped buried layers 126, 170. The first doped region 104 having the first type conductivity such as P type conductivity is formed by doping the lower doped region 122 and the upper doped region 124. The second doped region 106 having the first type conductivity such as P type conductivity is formed by doping the doped well region 128 and the doped buried layer 126. The third doped region 108 having the first type conductivity such as P type conductivity is formed by doping the lower doped region 122 and the upper doped region 124. The fourth doped region 110 having the first type conductivity such as P type conductivity is formed by doping the doped well region 172 and the doped buried layer 170.

Referring to FIG. 7C, the doped region 168 having the second type conductivity such as N type conductivity is formed by doping the second doped region 106. The doped contact region 156 having the first type conductivity such as P type conductivity is formed by doping the third doped region 108. The doped contact region 174 having the second type conductivity such as N type conductivity is formed by doping the fourth doped region 110. The dielectric structure 176 is formed on the first doped region 104. The dielectric structure 176 is not limited to FOX as shown in FIG. 7C. In other embodiments, the dielectric structure 176 may comprise other suitable insulating structures such as STI.

Next, referring to FIG. 3, the gate 140 and the gate structure 178 are formed on the substrate 102 and the dielectric structure 176. The gate 140 may comprise a gate dielectric layer and a gate electrode layer on the gate dielectric layer. The gate electrode layer may comprise a poly-silicon, metal or other suitable material. The gate dielectric layer may comprise oxide, nitride, oxy-nitride or other suitable materials. The gate structure 178 may comprise a gate dielectric layer and a gate electrode layer on the gate dielectric layer. The gate electrode layer may comprise a poly-silicon, metal or other suitable material. The gate dielectric layer may comprise oxide, nitride, oxy-nitride or other suitable materials. Next, other elements may be formed, such as the dielectric layer 158, the conductive layers 164, 166 and the conductive plugs 160, 162.

Figure 8A:
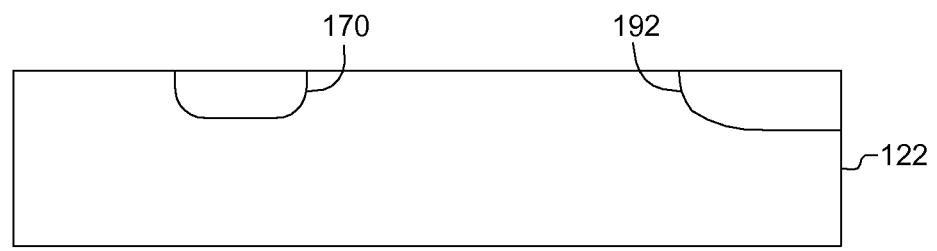
FIG. 8A to FIG. 8D illustrate a manufacturing method for a semiconductor structure according to one embodiment.

FIG. 8A to FIG. 8D illustrate a manufacturing method for the semiconductor structure in FIG. 4. Referring to FIG. 8A, the doped buried layers 170, 192 having the second type conductivity such as N type conductivity are formed by doping the lower doped region 122 having the first type conductivity such as P type conductivity.

Figure 8B:
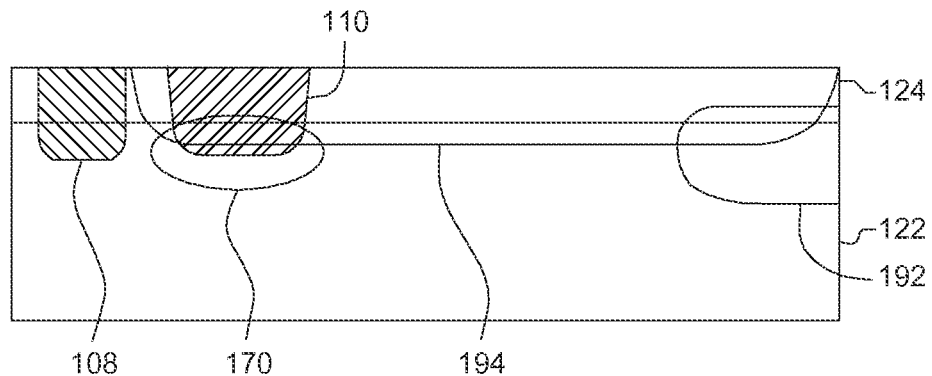

Referring to FIG. 8B, the upper doped region 124 is formed on the lower doped region 122. The upper doped region 124 may be formed by an epitaxial method. The upper doped region 124 may have the first type conductivity such as P type conductivity. In one embodiment, the doped buried layers 170, 192 may be diffused into the upper doped region 124 by an annealing step. The doped well region 194 having the second type conductivity such as N type conductivity is formed by doping the upper doped region 124, the lower doped region 122 and the doped buried layers 170, 192. The third doped region 108 having the first type conductivity such as P type conductivity is formed by doping the upper doped region 124 and the lower doped region 122. The fourth doped region 110 having the first type conductivity such as P type conductivity is formed by doping the doped well region 194 and the doped buried layer 170.

Figure 8C:
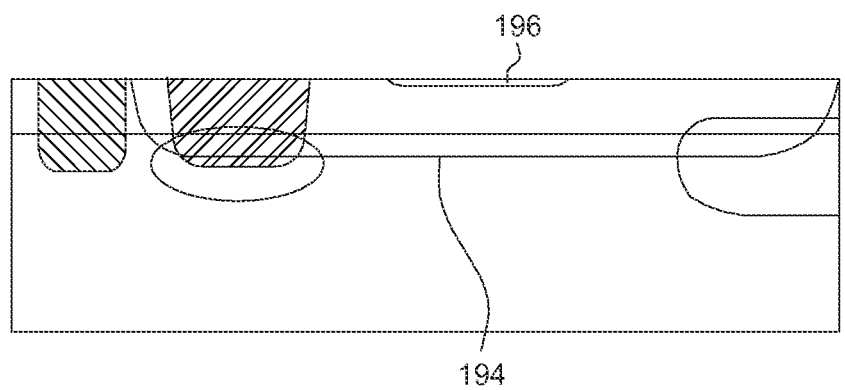
Figure 8D:
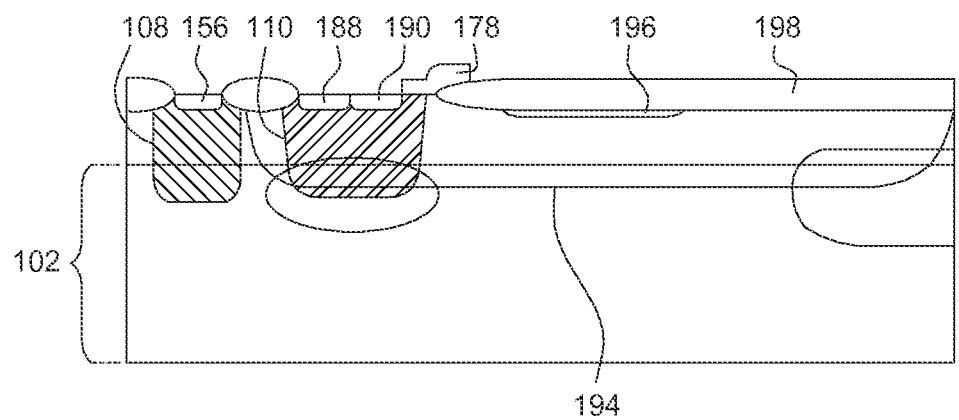

Referring to FIG. 8C, the doped region 196 having the first type conductivity such as P type conductivity is formed by doping the doped well region 194. Referring to FIG. 8D, a dielectric structure 198 may be formed on a doped well region 194 and a top doped region 196. The dielectric structure 198 is not limited to FOX as shown in FIG. 8D. In other embodiments, the dielectric structure 198 may comprise other suitable insulating structures such as STI. The gate structure 178 is formed on the substrate 102 and the dielectric structure 198. The gate structure 178 may comprise a gate dielectric layer and a gate electrode layer on the gate dielectric layer. The doped contact region 156 having the first type conductivity such as P type conductivity is formed by doping the third doped region 108. The doped contact region 188 having the first type conductivity such as P type conductivity is formed by doping the fourth doped region 110. The doped contact region 190 having the second type conductivity such as N type conductivity is formed by doping the fourth doped region 110. Next, other elements may be formed, such as the dielectric layer 158, the conductive layers 164, 166 and the conductive plugs 160, 162 to form the semiconductor structure as shown in FIG. 4.

Figure 9A:
FIG. 9A to FIG. 9C illustrate a manufacturing method for a semiconductor structure according to one embodiment.
Figure 9B:
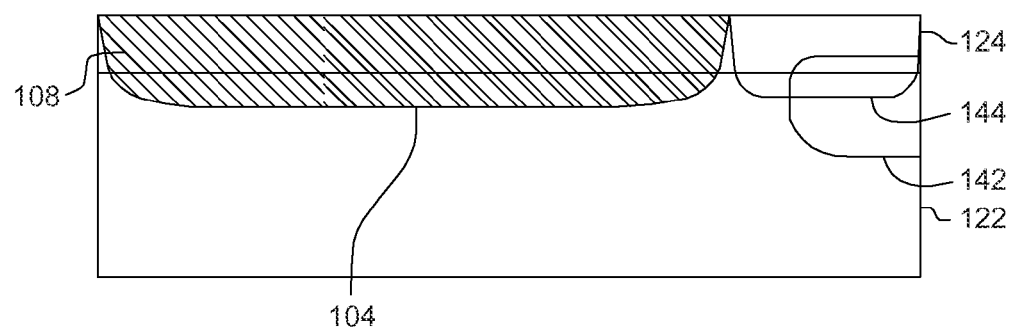
Figure 9C:
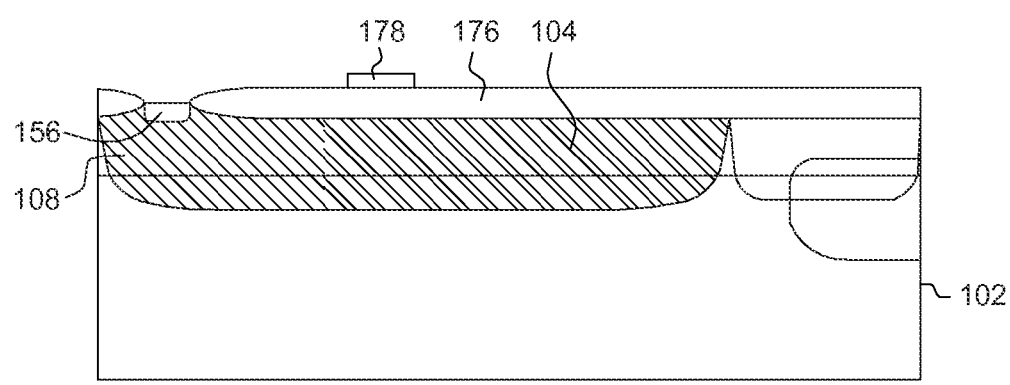

FIG. 9A to FIG. 9C illustrate a manufacturing method for the semiconductor structure in FIG. 5. Referring to FIG. 9A, the doped buried layer 142 having the second type conductivity such as N type conductivity is formed by doping the lower doped region 122 having the first type conductivity such as P type conductivity.

Referring to FIG. 9B, the upper doped region 124 is formed on the lower doped region 122. The upper doped region 124 may be formed by an epitaxial method. The upper doped region 124 may have the first type conductivity such as P type conductivity. In one embodiment, the doped buried layer 142 may be diffused into the upper doped region 124 by an annealing step. The doped well region 144 having the second type conductivity such as N type conductivity is formed by doping the upper doped region 124, the lower doped region 122 and the doped buried layer 142. The third doped region 108 and the first doped region 104 having the first type conductivity such as P type conductivity are formed by doping the upper doped region 124 and the lower doped region 122.

Referring to FIG. 9C, the dielectric structure 176 is formed on the substrate 102. The dielectric structure 176 is not limited to FOX as shown in FIG. 9C. In other embodiments, the dielectric structure 176 may comprise other suitable insulating structures such as STI. The gate structure 178 is formed on the dielectric structure 176. The gate structure 178 may comprise a gate dielectric layer and a gate electrode layer on the gate dielectric layer. The doped contact region 156 having the first type conductivity such as P type conductivity is formed by doping the third doped region 108. Next, other elements may be formed on the structure as shown in FIG. 9C, such as the dielectric layer 158, the conductive layers 164, 166 and the conductive plugs 160, 162 to form the semiconductor structure as shown in FIG. 5.

FIGS. 10-24 illustrate cross-section views of the semiconductor structures according to various embodiments, which can be applied into the symmetrical layout designs concepts according to present disclosure.

Figure 10:
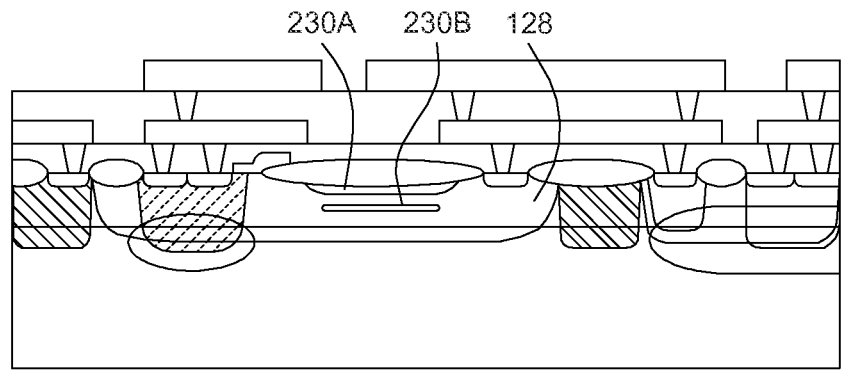
FIG. 10 illustrates a cross-section view of a semiconductor structure according to one embodiment.

The semiconductor structure in FIG. 10 is different from the semiconductor structure in FIG. 2 in that multi-layer top doped regions are used. For example, the top doped region 230A and the top doped region 230B both having the first type conductivity such as P type conductivity are separated from each other by the doped well region 128.

Figure 11:
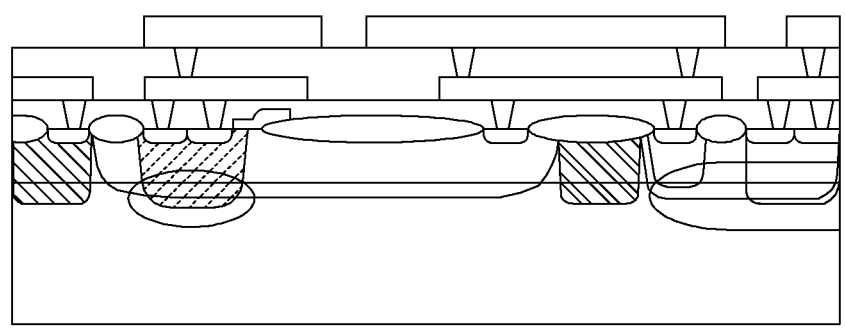
FIG. 11 illustrates a cross-section view of a semiconductor structure according to one embodiment.

The semiconductor structure in FIG. 11 is different from the semiconductor structure in FIG. 2 in that the top doped region 130 as shown in FIG. 2 is omitted.

Figure 12:
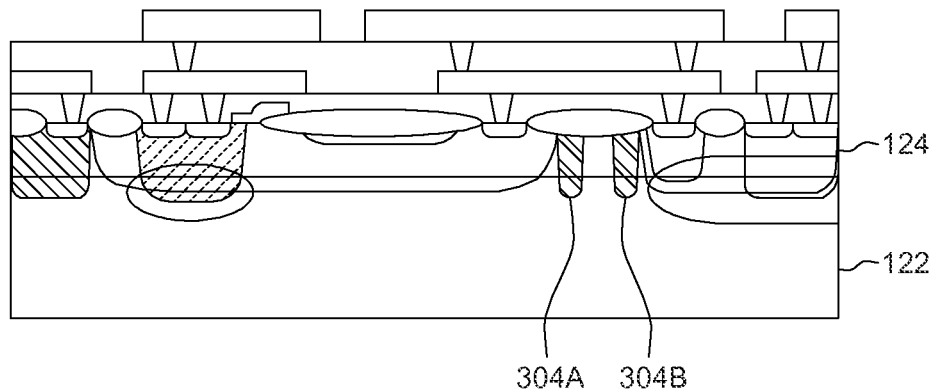
FIG. 12 illustrates a cross-section view of a semiconductor structure according to one embodiment.

The semiconductor structure in FIG. 12 is different from the semiconductor structure in FIG. 2 in that multi rows of the first doped regions 304A, 304B are used. The first doped regions 304A, 304B may be separated from each other by the lower doped region 122 and the upper doped region 124. Embodiments are not limited to the two rows of the first doped regions 304A, 304B shown in FIG. 12. In other embodiments, more than two rows of the first doped regions (not shown) may be used.

Figure 13:
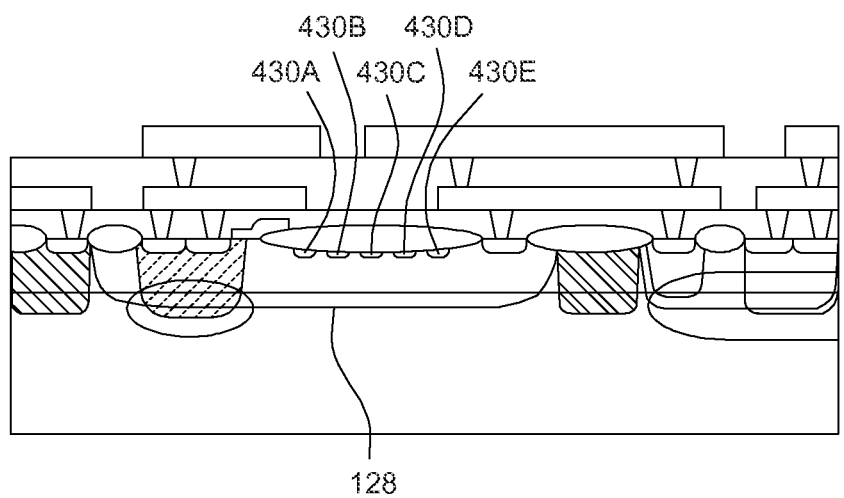
FIG. 13 illustrates a cross-section view of a semiconductor structure according to one embodiment.

The semiconductor structure in FIG. 13 is different from the semiconductor structure in FIG. 2 in that, multi rows of the top doped regions 430A, 430B, 430C, 430D, 430E are used. The top doped regions 430A, 430B, 430C, 430D, 430E may be separated from each other by the doped well region 128.

Figure 14:
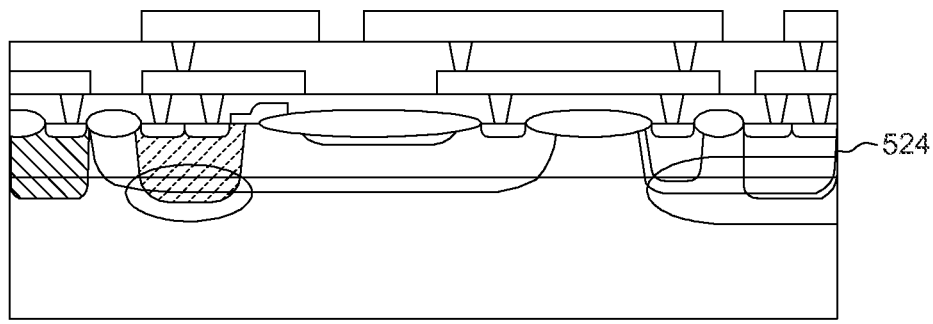
FIG. 14 illustrates a cross-section view of a semiconductor structure according to one embodiment.

The semiconductor structure in FIG. 14 is different from the semiconductor structure in FIG. 2 in that, the upper doped region 524 having the first type conductivity such as P type conductivity is used. In this embodiment, the first doped region 104 having the first type conductivity such as P type conductivity as shown in FIG. 2 is omitted.

Figure 15:
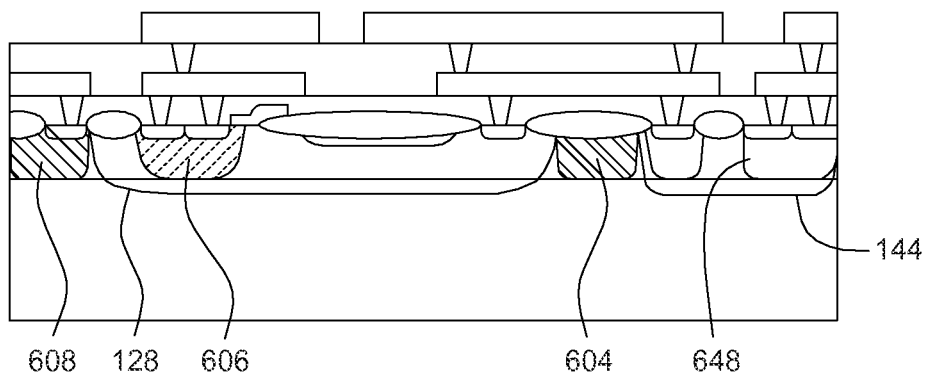
FIG. 15 illustrates a cross-section view of a semiconductor structure according to one embodiment.

The semiconductor structure in FIG. 15 is different from the semiconductor structure in FIG. 2 in that the doped buried layers 126, 142 having the second type conductivity such as N type conductivity as shown in FIG. 2 are omitted. In addition, depths of the first doped region 604, the second doped region 606, the third doped region 608 and the doped well region 648 in FIG. 15 are smaller than depths of the first doped region 104, the second doped region 106, the third doped region 108 and the doped well region 148 in FIG. 2, respectively. For example, as shown in FIG. 15, the second doped region 606 is shallower than the doped well region 128 substantially. The doped well region 648 is shallower than the doped well region 144 substantially. The semiconductor structure in FIG. 15 can use simpler process and lower cost than the semiconductor structure in FIG. 2.

Figure 16:
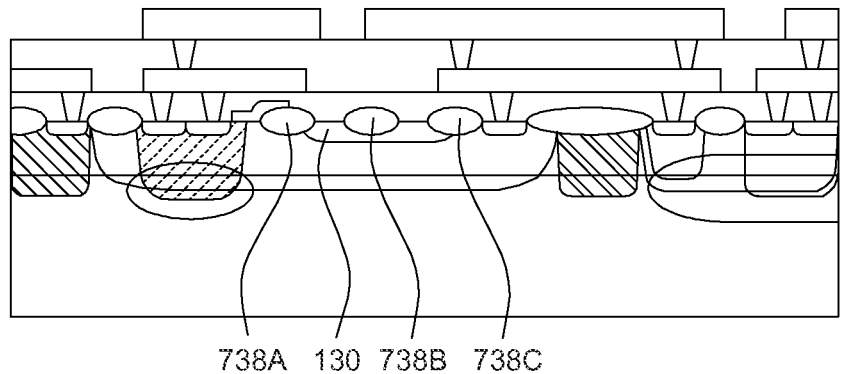
FIG. 16 illustrates a cross-section view of a semiconductor structure according to one embodiment.

The semiconductor structure in FIG. 16 is different from the semiconductor structure in FIG. 2 in that the dielectric structures 738A, 738B, 738C separated from each other are disposed on the top doped region 130. In this embodiment, the Rds-on of the device can be decreased.

Figure 17:
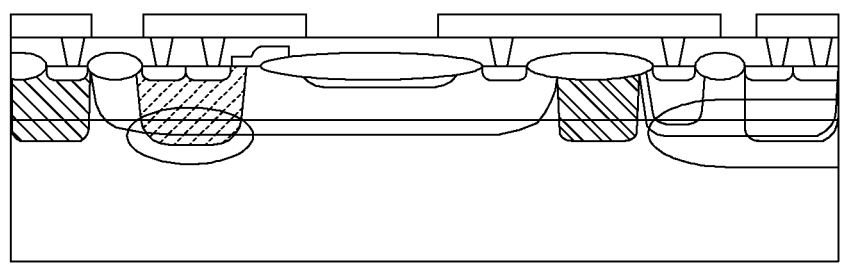
FIG. 17 illustrates a cross-section view of a semiconductor structure according to one embodiment.

The semiconductor structure in FIG. 17 is different from the semiconductor structure in FIG. 2 in that an upper portion of the dielectric layer 158, the conductive layer 166 (such as M2) and the conductive plug 162 in FIG. 2 are omitted. The semiconductor structure in FIG. 17 can use simpler process and lower cost than the semiconductor structure in FIG. 2.

Figure 18:
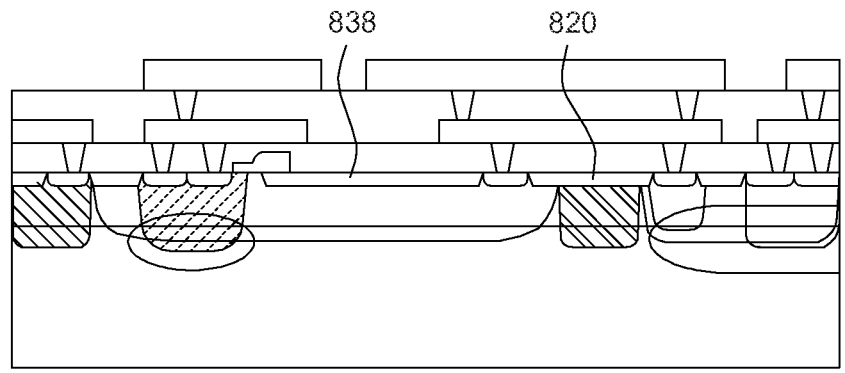
FIG. 18 illustrates a cross-section view of a semiconductor structure according to one embodiment.

The semiconductor structure in FIG. 18 is different from the semiconductor structure in FIG. 2 in that the dielectric structures 820, 838 use STI structures.

Figure 19:
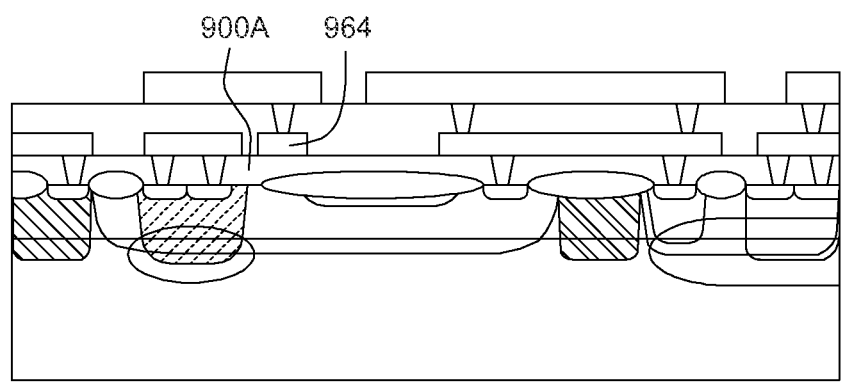
FIG. 19 illustrates a cross-section view of a semiconductor structure according to one embodiment.

The semiconductor structure in FIG. 19 is different from the semiconductor structure in FIG. 2 in that the gate 140 in FIG. 2 is omitted. In addition, the conductive layer 964 on the dielectric layer 900A of the first layer functions work of the gate 140 in FIG. 2. The conductive layer 964 may comprise metals.

Figure 20:
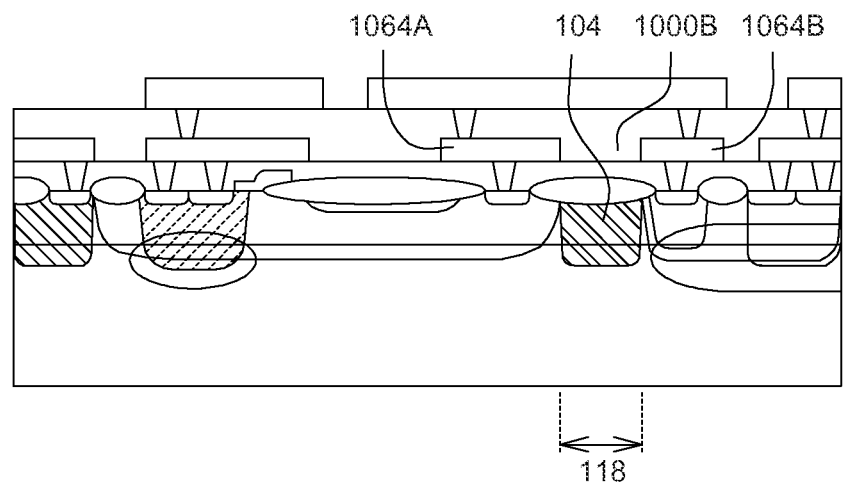
FIG. 20 illustrates a cross-section view of a semiconductor structure according to one embodiment.

The semiconductor structure in FIG. 20 is different from the semiconductor structure in FIG. 2 in that the conductive layers 1064A, 1064B (M1) are separated by the dielectric layer 10008 of the second layer on the first doped region 104 in the isolating region 118. In embodiments, conductive layers 1064A, 1064B adjacent to the isolating region 118 are partially overlapped with the first doped region 104 substantially.

Figure 21:
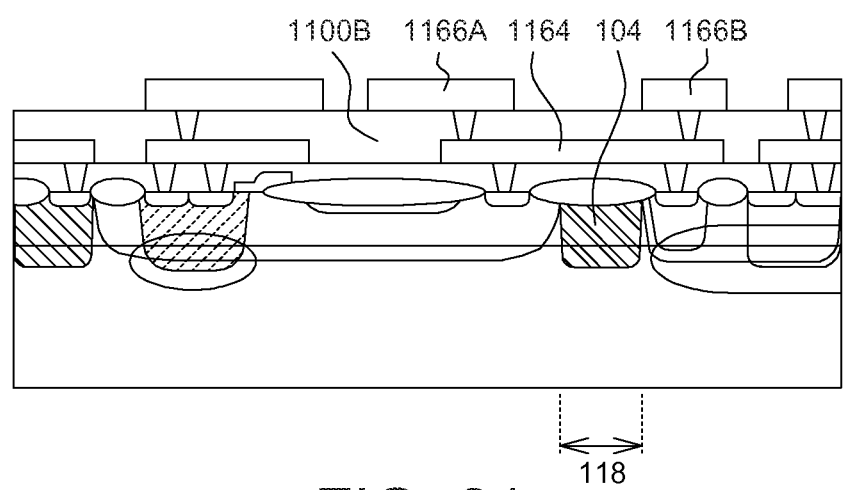
FIG. 21 illustrates a cross-section view of a semiconductor structure according to one embodiment.

The semiconductor structure in FIG. 21 is different from the semiconductor structure in FIG. 2 in that the conductive layers 1166A, 1166B (M2) are separated by the dielectric layer 11008 of the second layer on the first doped region 104 in the isolating region 118. In embodiments, the conductive layer 1164 (M1) and the first doped region 104 are overlapped with each other.

Figure 22:
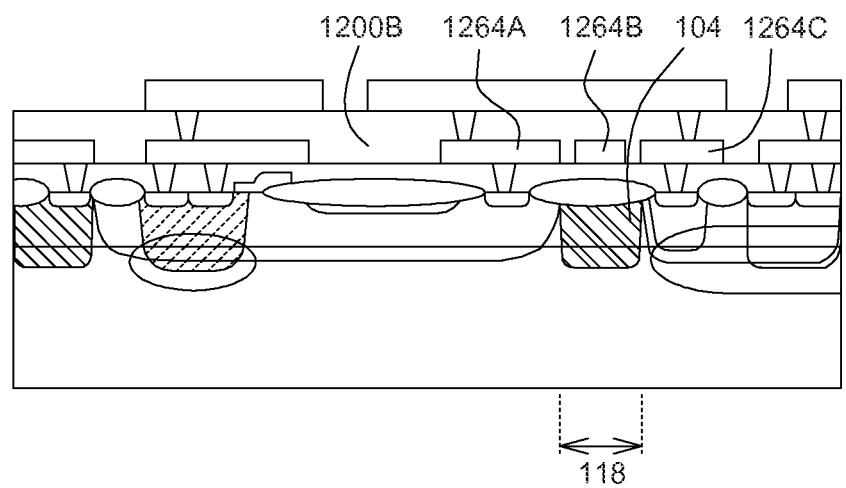
FIG. 22 illustrates a cross-section view of a semiconductor structure according to one embodiment.

The semiconductor structure in FIG. 22 is different from the semiconductor structure in FIG. 2 in that the conductive layers 1264A, 1264B, 1264C (M1) are separated by the dielectric layer 1200B of the second layer on the first doped region 104 in the isolating region 118. In embodiments, the conductive layers 1264A, 1264C adjacent to the isolating region 118 are partially overlapped with the first doped region 104 substantially. The conductive layer 1264B and the first doped region 104 are overlapped with each other.

Figure 23:
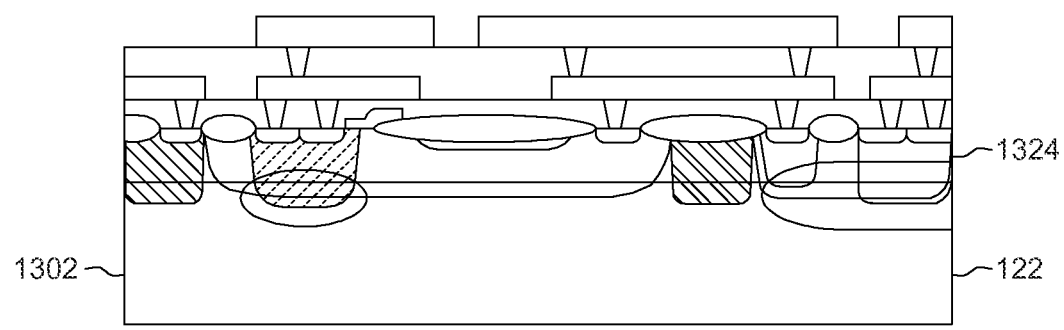
FIG. 23 illustrates a cross-section view of a semiconductor structure according to one embodiment.

The semiconductor structure in FIG. 23 is different from the semiconductor structure in FIG. 2 in that the upper doped region 1324 formed on the lower doped region 122 having the first type conductivity such as P type conductivity has the second type conductivity such as N type conductivity. In this embodiment, the voltage of the substrate 1302 can be boosted.

Figure 24:
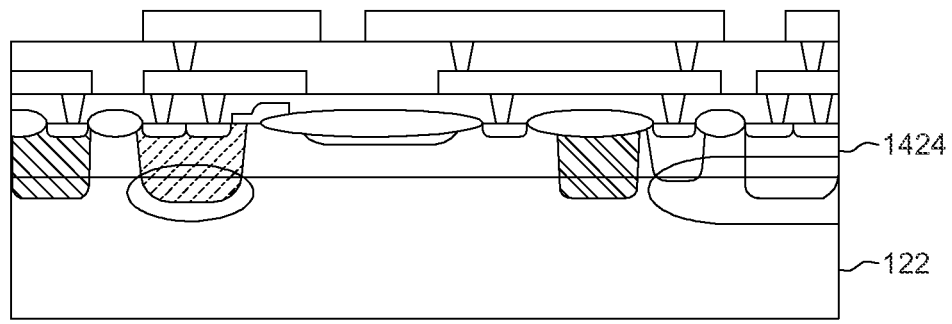
FIG. 24 illustrates a cross-section view of a semiconductor structure according to one embodiment.

The semiconductor structure in FIG. 24 is different from the semiconductor structure in FIG. 2 in that, the upper doped region 1424 formed on the lower doped region 122 having the first type conductivity such as P type conductivity has the second type conductivity such as N type conductivity. In addition, the doped well regions 128, 144 having the second type conductivity such as N type conductivity in FIG. 2 are omitted.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
 a substrate;
 a first device region;
 a second device region;
 a first doped region formed in the substrate adjacent to the second device region;

a second doped region formed in the substrate and located on the first device region;
a first gate structure on the first doped region;
a second gate structure on the second doped region, wherein the first doped region is overlapped with the first gate structure, the second doped region is overlapped with the second gate structure, the first doped region is a U-shaped doped region, and the second doped region is located in an opening of the U-shaped doped region;
a third doped region formed outside the first doped region and adjoined with two opposing ends of the first doped region facing the same side, wherein the first doped region and the third doped region have the same conductive type; and
a field oxide between the first gate structure and the second gate structure, wherein the first gate structure and the second gate structure are respectively on opposing end portions of the same field oxide.

2. The semiconductor structure according to claim 1, wherein the first device region and the second device region are separated from each other by the first doped region.

3. The semiconductor structure according to claim 1, comprising a dielectric structure between the first gate structure and the first doped region, wherein the dielectric structure has a symmetrical shape, the dielectric structure comprises the field oxide.

4. The semiconductor structure according to claim 1, wherein the first gate structure has a symmetrical shape.

5. The semiconductor structure according to claim 1, wherein the first doped region is between the first device region and the second device region, the second gate structure is disposed in the first device region.

6. The semiconductor structure according to claim 5, wherein the second gate structure has a first gate sidewall and a second gate sidewall opposite to the first gate sidewall, the smallest gap distance between the first doped region and the first gate sidewall is substantially equal to the smallest gap distance between the first doped region and the second gate sidewall.

7. The semiconductor structure according to claim 5, wherein the second gate structure has a first gate sidewall and a second gate sidewall opposite to the first gate sidewall, the smallest gap distance between the first gate structure and the first gate sidewall is substantially equal to the smallest gap distance between the first gate structure and the second gate sidewall.

8. The semiconductor structure according to claim 5, comprising a dielectric structure between the first gate structure and the first doped region, wherein the second gate structure is on the substrate in the first device region, the dielectric structure comprises the field oxide.

9. The semiconductor structure according to claim 1, wherein the first doped region is between the first device region and the second device region, the second doped region is in the substrate in the first device region, the first doped region and the second doped region are separated from each other and have the same conductivity type.

10. The semiconductor structure according to claim 9, wherein the second doped region has a first doped sidewall and a second doped sidewall opposite to the first doped sidewall, the smallest gap distance between the first doped region and the first doped sidewall is substantially equal to the smallest gap distance between the first doped region and the second doped sidewall.

11. The semiconductor structure according to claim 9, wherein the second doped region has a first doped sidewall and a second doped sidewall opposite to the first doped sidewall, the smallest gap distance between the first gate structure and the first doped sidewall is substantially equal to the smallest gap distance between the first gate structure and the second doped sidewall.

12. A semiconductor structure, comprising:
a substrate;
a first device region;
a second device region;
a first doped region formed in the substrate adjacent to the second device region;
a second doped region formed in the substrate and located on the first device region;
a third doped region formed in the substrate and along an outer edge of the first device region, wherein the third doped region comprises a doped contact region;
a first gate structure on the first doped region, wherein at least one of the first doped region and the first gate structure has a symmetrical shape;
a second gate structure on the second doped region, wherein the second doped region is overlapped with the second gate structure, the first device region is formed inside the first doped region, the first doped region is a U-shaped doped region, the third doped region is formed outside the first doped region and adjoined with two opposing ends of the first doped region facing the same side, and the first doped region and the third doped region have the same conductive type; and
a field oxide between the first gate structure and the second gate structure, wherein the first gate structure and the second gate structure are respectively on opposing end portions of the same field oxide.

13. The semiconductor structure according to claim 12, wherein the first doped region is between the first device region and the second device region, the second gate structure is in the first device region.

14. The semiconductor structure according to claim 13, wherein the second gate structure has a first gate sidewall and a second gate sidewall opposite to the first gate sidewall, the smallest gap distance between the first doped region and the first gate sidewall is substantially equal to the smallest gap distance between the first doped region and the second gate sidewall.

15. The semiconductor structure according to claim 13, wherein the second gate structure has a first gate sidewall and a second gate sidewall opposite to the first gate sidewall, the smallest gap distance between the first gate structure and the first gate sidewall is substantially equal to the smallest gap distance between the first gate structure and the second gate sidewall.

16. The semiconductor structure according to claim 12, wherein the first doped region is between the first device region and the second device region, the second doped region is in the substrate in the first device region, the first doped region and the second doped region are separated from each other and have the same conductivity type.

17. The semiconductor structure according to claim 16, wherein the second doped region has a first doped sidewall and a second doped sidewall opposite to the first doped sidewall, the smallest gap distance between the first doped region and the first doped sidewall is substantially equal to the smallest gap distance between the first doped region and the second doped sidewall.

18. The semiconductor structure according to claim 16, wherein the second doped region has a first doped sidewall and a second doped sidewall opposite to the first doped sidewall, the smallest gap distance between the first gate structure and the first doped sidewall is substantially equal to the smallest gap distance between the first gate structure and the second doped sidewall.

19. A method for manufacturing a semiconductor structure, comprising:
   forming a substrate comprising a first device region and a second device region;
   forming a first doped region in the substrate adjacent to the second device region;
   forming a second doped region in the substrate and located on the first device region;
   forming a third doped region outside the first doped region and adjoined with two opposing ends of the first doped region facing the same side, wherein the first doped region and the third doped region have the same conductive type;
   forming a field oxide;
   forming a first gate structure on the first doped region, wherein the first doped region is overlapped with the first gate structure; and
   forming a second gate structure on the second doped region, wherein the second doped region is overlapped with the second gate structure, the first doped region is a U-shaped doped region, the second doped region is located in an opening of the U-shaped doped region, the field oxide is between the first gate structure and the second gate structure, the first gate structure and the second gate structure are respectively on opposing end portions of the same field oxide.

\* \* \* \* \*